(12) United States Patent
Hennebelle

(10) Patent No.: US 9,412,058 B2
(45) Date of Patent: Aug. 9, 2016

(54) METHOD FOR ENCODING THE COLOR OF AN OBJECT IN MULTISPECTRAL FORM BY ADAPTIVE COMPRESSION, AND ASSOCIATED DECODING METHOD

(71) Applicant: COLOR GRAIL RESEARCH, Paris (FR)

(72) Inventor: Franck Hennebelle, Paris (FR)

(73) Assignee: COLOR GRAIL RESEARCH, Le Plessis Robinson (FR)

( * ) Notice: Subject to any disclaimer, the term of this patent is extended or adjusted under 35 U.S.C. 154(b) by 0 days.

(21) Appl. No.: 14/415,747

(22) PCT Filed: Jul. 17, 2013

(86) PCT No.: PCT/EP2013/065079
§ 371 (c)(1),
(2) Date: Feb. 28, 2015

(87) PCT Pub. No.: WO2014/012969
PCT Pub. Date: Jan. 23, 2014

(65) Prior Publication Data
US 2015/0178611 A1    Jun. 25, 2015

(30) Foreign Application Priority Data
Jul. 20, 2012 (FR) ..................................... 12 57051

(51) Int. Cl.
*G06K 19/00* (2006.01)
*G06K 19/06* (2006.01)
(Continued)

(52) U.S. Cl.
CPC .............. *G06K 19/0614* (2013.01); *G06K 7/12* (2013.01); *G06K 19/06056* (2013.01); *H03M 7/3059* (2013.01)

(58) Field of Classification Search
USPC .................................. 235/435, 439, 454, 462
See application file for complete search history.

(56) References Cited

U.S. PATENT DOCUMENTS 5,081,527 A    1/1992 Naito
6,115,508 A    9/2000 Lopresti et al.
(Continued)

FOREIGN PATENT DOCUMENTS

WO         0157485 A1    8/2001
WO      2006093376 A1    9/2006

OTHER PUBLICATIONS

International Search Report, dated Sep. 24, 2013, from corresponding PCT application.
(Continued)

*Primary Examiner* — Matthew Mikels
(74) *Attorney, Agent, or Firm* — Young & Thompson

(57) ABSTRACT

The present invention relates to a method for encoding the color of an object in multispectral form by adaptive compression, characterized in that said method comprises the following steps: determining an identifier of the color in the form of a logistics-dedicated code and having a European Article Numbering (EAN), Universal Product Code (UPC), or Domain Name System (DNS) distributed management structure; inserting a marker at the beginning of said code indicating that the code is a color code, as well as the type of storage; and creating a color encoding that can be interpreted by both a human being and a computer by being directly read, in the form of three elements, i.e. a sample of the color or of texture, a name, and a barcode/chip, using said code and the marker, which provides access to the bidirectional spectral reflectance of the color stored either locally or on a network, or both locally and on a network, and having a rendering model that is predetermined by said marker. The present invention likewise relates to an associated decoding method.

17 Claims, 2 Drawing Sheets

(51) Int. Cl.
*H03M 7/30* (2006.01)
*G06K 7/12* (2006.01)

(56) References Cited

U.S. PATENT DOCUMENTS

2006/0027662 A1* 2/2006 Baradi ............... G06K 7/12
                                                    235/469
2008/0000991 A1   1/2008 Yin et al.
2013/0037608 A1* 2/2013 Evevsky ............ G06F 21/31
                                                    235/380

OTHER PUBLICATIONS

Gondek et al., "Wavelength Dependent Reflectance Functions", Proceedings of the 21st Annual Conference on Computer Graphics and Interactive Techniques, Siggraph '94, pp. 213-220, XP055059399 (Jan. 1, 1994).

* cited by examiner

METHOD FOR ENCODING THE COLOR OF AN OBJECT IN MULTISPECTRAL FORM BY ADAPTIVE COMPRESSION, AND ASSOCIATED DECODING METHOD

FIELD OF THE INVENTION

The present invention relates to the field of color measurement.

The present invention more particularly relates to a method for compressed adaptive encoding of the color of an object in a multispectral form (measurement obtained by spectrophotometry). The purpose is to be able, inter alia, to store that information with very little memory in the form of a barcode (for example: QR code) or in a chip (RFID or other), send it easily to a third party (for example: via QR code or e-mail), simulate the color of an object a posteriori (for example: 2D/3D simulation) and compare the colors of objects (for example: computation of deltaE). This method is applicable to any point of an object. Depending on the method for modeling the object, the method may be extended to a uniform polygon and a texture formed from dots or polygons.

BACKGROUND OF THE INVENTION

A color is a light flow perceived by the human eye. It is a spectral energy distribution on a wavelength band, in this case 380 to 780 nm for the visible spectrum. Professional digital spectrophotometers currently measure these distributions with a pitch of five nm, or eighty-one values for the visible spectrum. Hereinafter, we will use a letter and a λ in parentheses to designate the eighty-one values that describe a spectral energy distribution S(λ) in the visible spectrum. This curve S(λ) may be interpolated with a reduced number of points $[\lambda_i, S(\lambda)_i]$, in the case at hand for the rest of this document a sealed cubic spline function with zero slopes at 380 and 780 nm.

Due to the additive synthesis, any color may be expressed by its trichromatic coordinates using three primary colors. There are several systems of primaries; hereinafter, we will use the two normalized sets, namely the CIE XYZ space (and its alternative CIE xyY with the constant-luminance chromaticity plan) and the CIE L*a*b space, which allows an accurate estimation of the color difference with a Euclidean norm called "deltaE". The "gamut" (limits) of these two spaces covers the entire spectrum visible to humans. We will also refer to the sRGB trichromatic space corresponding to the reference gamut for most of the current electronic equipment. The sRGB gamut does not cover the entire spectrum visible to humans, in particular in the blue-greens.

The color of an object is the spectrum C(λ) equal to the product of an illuminant I(λ) reflecting on a surface whose spectral reflectance is R(λ).

In other words, the color of an object may be characterized by its CIE XYZ or L*a*b trichromatic coordinates for a given illuminant (example: D65 or D50) or, better, by its spectral reflectance R(λ). This second method has the interest of being able to simulate the perception of the color under different illuminance (inside, outside). This is the color chart method: the user places the color chart next to the object and seeks, by iteration, the color from the chart that is closest to the color of the object, for example the Pantone Matching System (registered trademark for color names) or the RAL (Reichsausschulβ für Lieferbedingungen), which is a color codification system developed in 1927 by the German Institute for quality assurance and the associated marking.

The major interest of the charts is that they are much more precise/faithful in characterizing the color of an object than trichromatic coordinates (in particular to eliminate metamerism and provide information on the surface state: brilliance, roughness, etc.), while offering an encoding and storage system that is as simple as the trichromatic coordinates owing to the familiarity of the name and/or alphanumeric code. The major drawback of charts relative to trichromatic coordinates under a given illuminant lies in the relative and discontinuous/discrete nature of the storage of the information, i.e., a dictionary is necessary to establish a correspondence/communication between a spectrophotometric measurement and the codes of a color chart, to determine the equivalencies between the different color chart systems themselves (for example: transition from the Pantone name to a RAL code, etc.), and to have explicit data in order to simulate the behavior of a color, for example in 3D computer simulations.

Faced with these shortcomings, 3D programming has led to the development of many spectral reflectance models R(λ) to characterize surface renderings in order to create virtual objects with a realistic appearance (applications to architecture, for example) or to archive the characteristics of actual objects (virtual museums, e-commerce), to depict them with arbitrary lighting conditions and viewing angles. A new constraint, the simplicity of the formulation, has appeared jointly so that the choice or measurement of the descriptive parameters is easy and the calculations necessary for rendering of the synthesis images are done in a reasonable amount of time. The most widely known models are those, inter alia, of Lambert, Phong, Torrance and Sparrow, Beckmann and Spizzichino, Oren and Nayar, Ward, Ashikhmin, He, etc. They are based on image models or acquisition (example: gonioreflectometer).

All of these models have one point in common: the spectral reflectance that models the surface of the object is qualified as "bidirectional" in that it varies not only as a function of the wavelengths making up the illuminant, but also as a function of the incidence angle with which the illuminant strikes the surface and the incidence angle with which the viewer or camera views the surface. In fact, the incident light on the surface of a given object may interact with it differently. In the case of an opaque surface, three phenomena compete to give the material the appearance it is known for: absorption, reflection and diffusion.

In reference to the works by He, which are the most developed, the final expression of the bidirectional reflectance is broken down into three terms: specular (s)/specular peak, directional diffuse (dd)/specular lobe, uniform diffuse (du)—as illustrated in FIG. 1:

$$R_{bd}(\lambda, \overline{L}, \overline{V}, \overline{N}) = R_{bd,s} + R_{bd,dd} + R_{bd,du}$$

The specular reflection or specular peak occurs on the surface of the object. The light is reflected in the theoretical direction defined by the Snell-Descartes laws. There is very little interaction of light with the material of the object, and in particular its pigments. The color of the reflected light is therefore close to the color of the received light (e.g.: mirror, high gloss paint). The specular component of He comes from the unique reflection of the light on the average level of the surface. In the case of a smooth surface, this component predominates the others and a specular peak is indeed observed.

The directional diffuse or specular lobe reflection corresponds to the light reflected inside a cone/lobe centered on that same direction of the Snell-Descartes laws (e.g.: satin paint). The directional diffuse component is due to the unique reflection of the light on the roughness of the surface (diffraction phenomenon).

The uniform diffuse reflection takes place on a deeper level and the emitted light is tinted by the color of the pigments (e.g.: matte paint). This third component is attributed to the multiple reflections and the interactions of the light with the surface material.

The interest of the bidirectional spectral reflectance models is their capacity to characterize the color of an object as faithfully as a color chart (for example: multispectral color, brilliance, roughness, etc.) while offering storage of the information that is both absolute and continuous, in the sense that no dictionary is necessary to establish a correspondence/communication between a spectrophotometric measurement and the codes of a color chart, to determine equivalencies between the different color chart systems themselves (for example: transition from a Pantone name to a RAL code, etc.) and have explicit data in order to simulate the behavior of a color. The major drawback of these models is that they require a significant quantity of information that is impossible for an individual to remember and/or to store easily on a paint can in a display (for example: barcode or chip). Several methods have been proposed to compress the data resulting from a direct measurement (or a simulation from a microscopic geometric surface model) of the bidirectional reflectance: the spherical harmonics, lengths affixed on a geodesic sphere or spherical wavelets. These also require improvements, since they again have the double drawback of requiring large storage capacities and long computation times.

The following are known from the state of the art:

Application PCT WO 2006/093376, which describes a method for generating a barcode.

European patent no. EP 0,961,475, which relates to a rendering apparatus, multispectral image scanner and automatic three-dimensional goniospectrophotometer. However, this European patent only pertains to the acquisition of the bidirectional spectral reflectance, and not its adaptive compressed storage.

In the field of compression by spherical harmonics, the following scientific publication: B. Cabral, N. Max, R. Springmeyer. *"Bidirectional reflection functions from surface bump maps"*. SIGGRAPH '87 (1987), pp. 273-281.

In the field of compression by spherical harmonics, the following scientific publication: S. H. Westin, J. R. Arvo, K. E. Torrance. *"Predicting reflectance functions from complex surfaces"*. SIGGRAPH '92 (1992), pp. 255-264.

In the field of compression by lengths affixed on a geodesic sphere, the following scientific publication: J. S. Gondek, G. W. Meyer, J. G. Newman. *"Wavelength dependent reflectance functions"*. SIGGRAPH '94 (1994), pp. 213-220.

In the field of compression by spherical wavelets, the following scientific publication: Schröder, W. Sweldens. *"Spherical wavelets: Efficiently represented functions on the sphere"*. SIGGRAPH '95 (1995).

BRIEF DESCRIPTION OF THE INVENTION

The present invention aims to resolve the drawbacks of the prior art by proposing a method for performing an adaptive compressed encoding of the color of an object to multispectral form (measurement obtained by spectrophotometry). One of the aims of the present invention is to be able, inter alia, to store this information with very little memory in the form of a barcode (for example: QR code) or in a chip (RFID or other), to send it to a third party easily (for example: via QR code or an e-mail), simulate the color of an object a posteriori (for example: 2D/3D simulation) and compare the colors of objects (for example: computation of deltaE). The method according to the present invention is applicable to any point of an object. Depending on the modeling method of the object, the method may be extended to a uniform polygon and the texture formed from points or polygons.

To that end, the present invention relates, in its most general accepted form, to a method for encoding the color of an object in multispectral form by adaptive compression, characterized in that it comprises the following steps:

determining an identifier of the color in the form of the logistics-dedicated code and having a European Article Numbering (EAN), Universal Product Code (UPC), or Domain Name System (DNS) distributed management structure;

inserting a marker at the beginning of said code indicating that the code is a color code, as well as the type of storage; and creating a color encoding that can be interpreted by both a human being and a computer by being directly read, in the form of three elements, i.e., a sample of the color or of a texture, a name, and a barcode/chip, using said code and the marker, which provides access to the bidirectional spectral reflectance of the color stored either offline or on a network, or both offline and on a network, and having a rendering model that is predetermined by said marker.

The encoding method according to the present invention makes it possible to distribute the storage of the information between an "offline" storage unit and a storage unit distributed in the network or "cloud".

The "offline" storage unit (barcode/chip) comprises:

A marker indicating the type of the offline storage;

An identifier of the color in the form of a European Article Numbering (EAN) code or Universal Product Code (UPC). This identifier serves both as an identifier for the product in a store display, and as a secondary URL to access the rest of the code stored in the "cloud" (the primary URL, of the Internet type, is linked to the marker);

Optionally, a password associated with the EAN/UPC code in order to access the cloud.

Codes of the European Article Numbering (EAN), Universal Product Code (UPC) or Domain Name System (DNS) type make it possible to inventory items.

The cloud storage unit contains the rest of the code (for example: the parameters of the bidirectional reflectance model), and optionally, services, for example a direct surface rendering computation.

According to one embodiment, a primary URL (Uniform Resource Locator) is provided by said marker, and the secondary URL is provided by said code.

Advantageously, the storage of the bidirectional spectral reflectance information is distributed between an offline unit and a network or cloud unit.

Preferably, the link between the offline unit and the cloud unit is made by said marker (primary URL) and said EAN/UPS code (secondary URL).

According to one embodiment, the functions characterizing the color of the item (for example: spectral reflectance) are subject to a double compression level: interpolation by sealed cubic spline, the description of the coordinates of the interpolation points via relative pitches between points on the x-axis and y-axis.

Advantageously, said method further comprises a step for storage, in the offline storage unit, of the minimum amount of information to represent a multispectral color in the simplified manner without requiring access to the cloud (a marker indicating the type of the offline storage, an identifier of the color in the form of an EAN, UPC or DNS code, the name of the color, the uniform diffuse spectral reflectance of the color, compressed in the form of interpolation point coordinates (x-axis equals wavelength in nm, y-axis equals % reflectance) connected by a sealed cubic spline function, a code on the surface state: matte/satin/glossy, Light Reflectance Value index).

According to one alternative, said method further comprises a step for storage of the offline unit within a barcode of the QR-code type (registered trademark).

According to another alternative, the method further comprises a step for storing the offline unit within a barcode of the "Data Matrix" type (registered trademark).

According to another alternative, said method further comprises a step for storing the offline unit within a barcode of the "Aztec" type (registered trademark).

According to another alternative, said method further comprises a step for storing the offline unit within a chip (RFID or other).

Advantageously, said method further comprises a step consisting of affixing, by overlay on the barcode/chip or next to the latter, a label with a sample of the color that it represents.

This mode allows direct reading of the color for a human being, like a color chart. The overlay is applicable in the case of a barcode incorporating an error correction system (for example: QR code).

Preferably, said method is implemented with a mobile telephone, tablet or computer provided with an image sensor or chip reader.

According to one embodiment, said method is implemented with a dedicated sensor for the barcode or chip.

Depending on the embodiment, said method implements the reflectance model of Lambert, Phong and Blinn, Torrance and Sparrow, Beckmann and Spizzichino, Oren and Nayar, Ward, Ashikhmin or He.

According to one particular embodiment, the method implements a spherical harmonics compression in the cloud storage unit.

According to one alternative, said method implements a compression by lengths affixed on a geodesic sphere in the cloud storage unit.

According to another alternative, said method implements a spherical wavelet compression in the cloud storage unit.

The present invention also relates to a method for decoding and rendering the color of an encoding that has been encoded using the method described above, said decoding method comprising the following steps:

decoding said marker and said code, which indicate a primary URL and a secondary URL, the encoding method and the location where the information should be sought; and generating a two-dimensional spectral reflectance.

In summary, the contribution of the present invention to the state of the art at least consists of the following elements:

Distributed encoding between offline and cloud;

The use of a marker and an EAN/UPC code to make the link between the offline and the cloud (notion of primary and secondary URL, respectively);

The offline encoding can be interpreted directly both by human beings (paint label and name) and the computer (barcode and code to perform a posteriori 2D/3D rendering); and The double level of compression of the reflectance curves: interpolation by sealed cubic spline, the description of the coordinates of the interpolation points via relative pitch is between points on the x-axis and y-axis.

BRIEF DESCRIPTION OF THE DRAWINGS

The invention will be better understood using the description provided below, purely for information, of one embodiment of the invention, in reference to the Figures, in which.

DETAILED DESCRIPTION OF THE INVENTION

Figure 1:
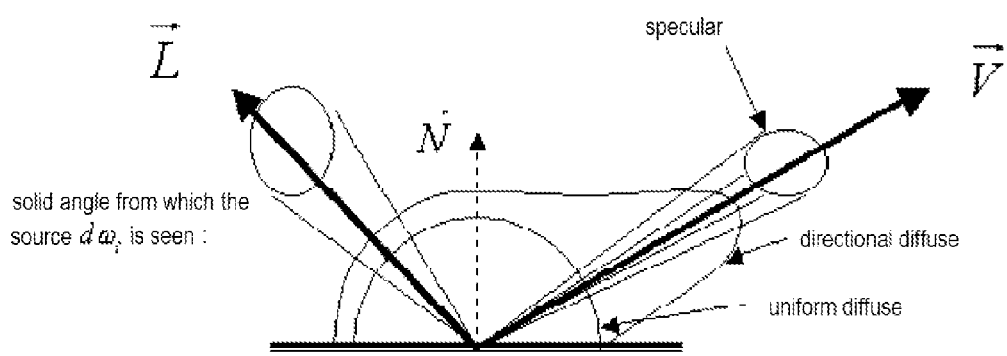
FIG. 1 very diagrammatically illustrates the final expression of the bidirectional reflectance of He, which is broken down into three terms: specular (s)/specular peak, directional diffuse (dd)/specular lobe, uniform diffuse (du)
Figure 2:
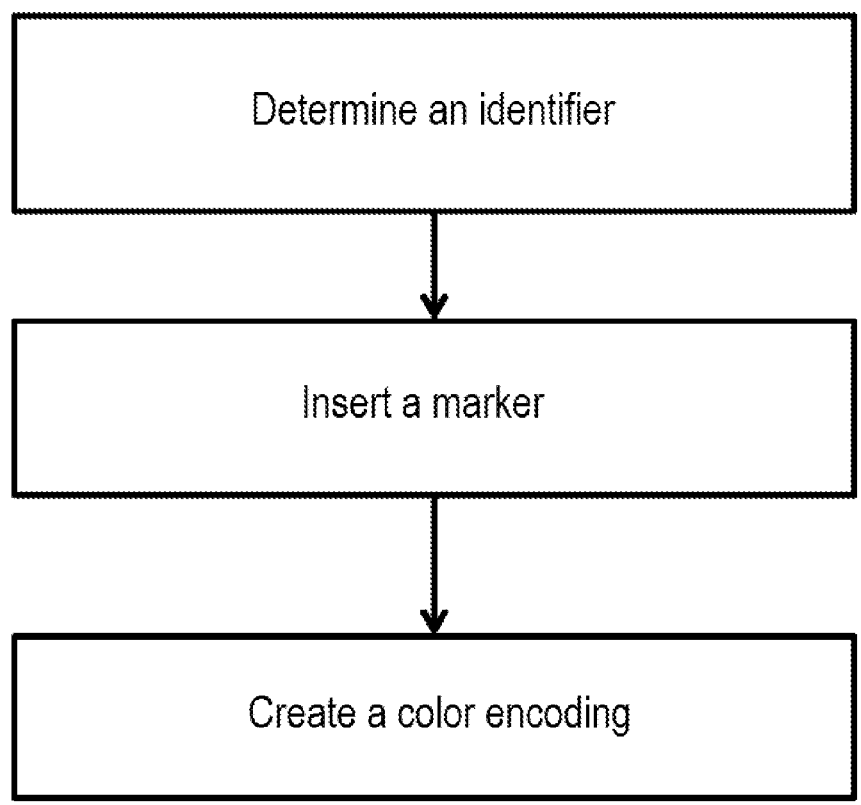
FIG. 2 shows the different steps of the method according to the present invention.

Consider the example of the embodiment in which said method stores a minimum amount of information in the offline storage unit to represent a multispectral color in a simplified manner without requiring access to the cloud in the form of a QR code Version 4 (33 x 33) with the "M" error correction level (15%).

This QR code can contain a maximum of ninety alphanumeric characters. Since the standard size of a point is at least 0.254 mm, this QR code is a square measuring at least 1.5×1.5 cm. This size is appropriate to appear in a color chart box or on a paint can in a display. The user is shown that this is a color code by affixing a logo in the center (e.g.: "CC"), or a label with a sample of the paint, even if it means enlarging the size of the code.

The QR code offers alphanumeric encoding with 45 possible characters (0-9, A-Z [capital letters only], space, $, %, *, +, -, ., /, :).

The 90 alphas are as follows:

Alphas 1-4: or a 4 alphas: CCOO (2025 possible types)

Alphas 5-16: EAN13 without the control character because the QR code and the Color Code already have an error correction system: 12 Alphas Alphas 17-48: name of the color over 32 Alphas Alphas 49-50: 2 alphas, header of the encoding by interpolation points with sealed cubic spline: A49=no. of interpolation points=n+1 (less than 18 to encapsulate in a QR code with 90 alphas), A50=code path Dx and Dy (0=1×1; 1=2×1; 2=1×2; 3=2×2; 4=5×1; 5=5×1; 6=5×5; 7=10×1; 8=1×10; 9=10×10)

Alphas 51-53: coordinates of the interpolation point i=0; A51=-DL0 in nm vs. 280 nm (0-44 to be multiplied by the code A50); A52+A53=RDU0 in % (0-44+0-44 to be multiplied by A50).

Alphas 54+2x(i−1): coordinates of the interpolation point i(0<i≤n), expressed by a DXi=Xi−Xi−1 in nm (0-44 to be multiplied by the code A50) and by a DRDUi=RDUi−RDUi−1 in % (0-44 to be multiplied by the code A50)

Alpha 88: brilliance coefficient in %, alpha code to be multiplied by 5

Alpha 89: LRV (Light Reflectance Value) coefficient in %, alpha code to be multiplied by 5

Alpha 90: control code: (computation identical to that of the EAN code)

The part in the cloud stores the parameters of a complete He model, namely:

$$R_{bd,s} = \frac{F \cdot e^{-g} \cdot G(\theta_i, \theta_r)}{\cos\theta_i \, d\omega_i} \Delta$$

$$R_{bd,dd} = \frac{F \cdot G(\theta_i, \theta_r) \cdot M \cdot D}{\pi \cos\theta_i \cos\theta_r}$$

where:

F is the Fresnel energy coefficient whereof the expression is provided with the Torrance and Sparrow model.

$$g = \left(\frac{2\pi\sigma_\beta}{\lambda}(\cos\theta_i + \cos\theta_r)\right)^2$$

characterizes the surface roughness. Here, the actual roughness is used:

$$\sigma_\beta = \frac{\sigma}{\sqrt{1 + \left(\frac{z}{\sigma}\right)^2}}$$

where z is the root of the following equation:

$$\sqrt{\frac{\pi}{2}} z = \frac{\sigma}{4}(K_i + K_r)\exp\left(-\frac{z^2}{2\sigma^2}\right),$$

in which:

$$K = \tan\theta \cdot \mathrm{erfc}\left(\frac{T}{2\sigma}\cot\theta\right)$$

G is Smith's geometric attenuation factor, the expression of which is provided above.

D is a Kronecker function, which is equal to 1 within the specular reflection cone and 0 outside it.

$$D = \frac{\pi^2 T^2}{4\lambda^2} \sum_{m=1}^{\infty} \frac{g^m e^{-g}}{m!m} \exp\left(-\frac{v_{xy}^2 T^2}{4m}\right)$$

is a distribution that was already found in the Beckmann and Spizzichino model $$\vec{v} = \vec{V} - \vec{L}_{et} v_{xy} = \sqrt{v_x^2 + v_y^2}$$

$$M = \left(\frac{\vec{v} \cdot \vec{v}}{v_z}\right)^2 \frac{\left(\left(\vec{s}_r \cdot \vec{L}\right)^2 + \left(\vec{p}_r \cdot \vec{L}\right)^2\right) \cdot \left(\left(\vec{s}_i \cdot \vec{L}\right)^2 + \left(\vec{p}_i \cdot \vec{L}\right)^2\right)}{\|\vec{V} \wedge \vec{L}\|^4}$$

$$\vec{s}_i = \frac{\vec{L} \wedge \vec{N}}{\|\vec{L} \wedge \vec{N}\|_{et}} \vec{s}_r = \frac{\vec{V} \wedge \vec{N}}{\|\vec{V} \wedge \vec{N}\|}$$

$$\vec{p}_i = \vec{s}_i \wedge \vec{L}_{et} \vec{p}_r = \vec{s}_r \wedge \vec{L}$$

and

The invention has been described above as an example. It is understood that one skilled in the art can produce different alternatives of the invention without going beyond the scope of the patent.

The invention claimed is:

1. A method for encoding the color of an object in multispectral form by adaptive compression, the method comprising:
    determining an identifier of the color in the form of the logistics-dedicated code and having a European Article Numbering (EAN), Universal Product Code (UPC), or Domain Name System (DNS) distributed management structure;
    inserting a marker at the beginning of said code indicating that the code is a color code, as well as the type of storage; and
    creating a color encoding using said code and the marker, which provide access to the bidirectional spectral reflectance of the color stored either offline or on a network, or both offline and on a network, and having a rendering model that is predetermined by said marker,
    wherein the functions characterizing the color of the item are subject to a double compression level:
        interpolation by sealed cubic spline, then
        the description of the coordinates of the interpolation points via relative pitches between points on the x-axis and y-axis.

2. The encoding method according to claim 1, wherein a primary Uniform Resource Locator (URL) is provided by said marker, and a secondary URL is provided by said code.

3. The encoding method according to claim 1, wherein the storage of the bidirectional spectral reflectance information is distributed between an offline unit and a network or a cloud unit.

4. The encoding method according to claim 3, wherein the link between the offline unit and the cloud unit is made by said marker and said code.

5. The method according to claim 3, wherein said method further comprises:
    storing, in the offline storage unit, the minimum amount of information to represent a multispectral color in the simplified manner without requiring access to the cloud (a marker indicating the type of the offline storage, an identifier of the color in the form of an EAN, UPC or DNS code, the name of the color, the uniform diffuse spectral reflectance of the color, compressed in the form of interpolation point coordinates (x-axis equals wavelength in nm, y-axis equals % reflectance) connected by a sealed cubic spline function, a code on the surface state: matte/satin/glossy, Light Reflectance Value index).

6. The method according to claim 2, wherein said method further comprises a step for storage of the offline unit within a code of the QR-code type (registered trademark), a code of the "Data Matrix" type (registered trademark) and a code of the "Aztec" type (registered trademark).

7. The method according to claim 2, wherein said method further comprises:
    storing the offline unit within a chip.

8. The method according to claim 1, wherein said method further comprises:
    affixing by overlay on the barcode/the chip.

9. The method according to claim 1, wherein said method further comprises:
    affixing a label with a sample of the color that it represents by overlay alongside.

10. The method according to claim 1, implemented with one element among a mobile telephone, a tablet, a computer provided with an image sensor or a computer provided with a chip reader.

11. The method according to claim 1, implemented with a dedicated sensor for the barcode or the chip.

12. The method according to claim 1, wherein the method implements a model chosen from among:
the Lambert reflectance model,
the Phong and Blinn reflectance model,
the Torrance and Sparrow reflectance model,
the Beckmann and Spizzichino reflectance model,
the Oren and Nayar reflectance model,
the Ward reflectance model,
the Ashikhmin reflectance model, and
the He reflectance model.

13. The method according to claim 3, wherein the method implements a compression in the cloud storage unit, the compression being chosen from among a spherical harmonics compression, a compression by lengths affixed on a geodesic sphere or a spherical wavelet compression.

14. A method for decoding and rendering the color of an encoding that has been encoded using the method according to claim 1, said decoding method comprising the following steps:
decoding said marker and said code, which indicate a primary URL and a secondary URL, the encoding method and the location where the information should be sought; and
generating a two-dimensional spectral reflectance.

15. The method according to claim 1, wherein the color encoding is in the form of three elements:
at least one of a sample of the color and a texture,
a name, and
at least one of a barcode and a semiconductor chip.

16. A method for encoding the color of an object in multi-spectral form by adaptive compression, the method comprising:
determining an identifier of the color in the form of the logistics-dedicated code and having a European Article Numbering (EAN), Universal Product Code (UPC), or Domain Name System (DNS) distributed management structure;
inserting a marker at the beginning of said code indicating that the code is a color code, as well as the type of storage; and
creating a color encoding using said code and the marker, which provide access to the bidirectional spectral reflectance of the color stored either offline or on a network, or both offline and on a network, and having a rendering model that is predetermined by said marker,
wherein the method implements a model chosen from among:
the Lambert reflectance model,
the Phong and Blinn reflectance model,
the Torrance and Sparrow reflectance model,
the Beckmann and Spizzichino reflectance model,
the Oren and Nayar reflectance model,
the Ward reflectance model,
the Ashikhmin reflectance model, and
the He reflectance model.

17. A method for encoding the color of an object in multi-spectral form by adaptive compression, the method comprising:
determining an identifier of the color in the form of the logistics-dedicated code and having a European Article Numbering (EAN), Universal Product Code (UPC), or Domain Name System (DNS) distributed management structure;
inserting a marker at the beginning of said code indicating that the code is a color code, as well as the type of storage; and
creating a color encoding using said code and the marker, which provide access to the bidirectional spectral reflectance of the color stored either offline or on a network, or both offline and on a network, and having a rendering model that is predetermined by said marker,
wherein the storage of the bidirectional spectral reflectance information is distributed between an offline unit and a network or a cloud unit, and
wherein the method implements a compression in the cloud storage unit, the compression being chosen from among a spherical harmonics compression, a compression by lengths affixed on a geodesic sphere or a spherical wavelet compression.

* * * * *